(12) United States Patent
Chang et al.

(10) Patent No.: US 11,749,648 B2
(45) Date of Patent: Sep. 5, 2023

(54) CIRCUIT STRUCTURE FOR TESTING THROUGH SILICON VIAS IN THREE-DIMENSIONAL INTEGRATED CIRCUIT

(71) Applicant: Powerchip Semiconductor Manufacturing Corporation, Hsinchu (TW)

(72) Inventors: Shou-Zen Chang, Hsinchu (TW); Chun-Lin Lu, Hsinchu (TW); Chun-Cheng Chen, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 300 days.

(21) Appl. No.: 17/373,803

(22) Filed: Jul. 13, 2021

(65) Prior Publication Data
US 2022/0310564 A1 Sep. 29, 2022

(30) Foreign Application Priority Data
Mar. 23, 2021 (TW) .................................. 110110430

(51) Int. Cl.
| | |
|---|---|
| *G01R 19/00* | (2006.01) |
| *H01L 25/065* | (2023.01) |
| *H01L 23/00* | (2006.01) |
| *G01R 15/12* | (2006.01) |
| *G01R 21/133* | (2006.01) |

(52) U.S. Cl.
CPC .......... *H01L 25/0657* (2013.01); *G01R 15/12* (2013.01); *G01R 19/0084* (2013.01); *G01R 19/0092* (2013.01); *G01R 21/133* (2013.01); *H01L 24/16* (2013.01); *H01L 2224/16146* (2013.01); *H01L 2225/06513* (2013.01); *H01L 2225/06541* (2013.01); *H01L 2225/06596* (2013.01); *H01L 2924/00* (2013.01); *H01L 2924/0002* (2013.01)

(58) Field of Classification Search
CPC ................. H01L 25/0657; H01L 24/16; H01L 2224/16146; H01L 2225/06513; H01L 2225/06541; H01L 2225/06596; H01L 25/18; H01L 22/34; H01L 22/12; H01L 23/5384; H01L 2924/00; H01L 2924/0002; H01L 2224/48247; G01R 15/12; G01R 31/2853; G01R 31/2856; G01R 31/54; G01R 19/0092; G01R 19/0084; G01R 21/133
USPC ............................................ 324/76.11–76.83
See application file for complete search history.

(56) References Cited

U.S. PATENT DOCUMENTS

| | | | |
|---|---|---|---|
| 2012/0025388 A1* | 2/2012 | Law .................... | H01L 25/0657 257/773 |
| 2012/0249178 A1* | 10/2012 | Su .......................... | H01L 22/34 324/762.03 |

* cited by examiner

*Primary Examiner* — Raul J Rios Russo
(74) *Attorney, Agent, or Firm* — Winston Hsu (57) ABSTRACT

A circuit structure for testing through silicon vias (TSVs) in a 3D IC, including a TSV area with multiple TSVs formed therein, and a switch circuit with multiple column lines and row lines forming an addressable test array, wherein two ends of each TSV are connected respectively with a column line and a row line. The switch circuit applies test voltage signals through one of the row lines to the TSVs in the same row and receives current signals flowing through the TSVs in the row from the columns lines, or the switch circuit applies test voltage signals through one of the column lines to the TSVs in the same column and receives current signals flowing through the TSVs in the column from the row lines.

14 Claims, 8 Drawing Sheets

CIRCUIT STRUCTURE FOR TESTING THROUGH SILICON VIAS IN THREE-DIMENSIONAL INTEGRATED CIRCUIT

BACKGROUND OF THE INVENTION

1. Field of the Invention

The present invention relates generally to a circuit structure for testing through silicon vias, and more specifically, to a circuit structure for testing the continuity of through silicon vias in three-dimensional integrated circuit.

2. Description of the Prior Art

Figure 1:
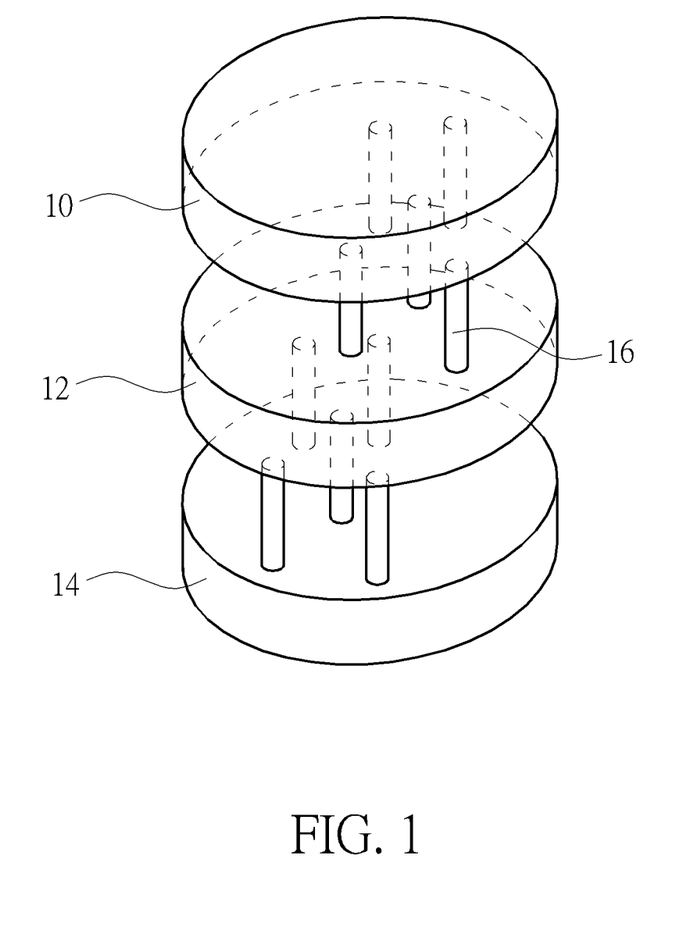
FIG. 1 is a schematic view of 3D stacked wafers.

With progress in semiconductor manufacturing technology, a multitude of chips may now be integrated into one single package. And in a single package, the connection between chips is realized by TSV structures. A through-silicon-via (TSV) is a conductive via that provides electrical continuity through a silicon wafer or die. For example, as shown in FIG. 1, three wafers 10, 12, 14 are stacked and electrically connected with each other through TSVs 16 to communicate circuit signals. TSVs enable two or more integrated circuit (IC) devices to be stacked vertically into a three-dimensional (3D) chip stack. For example, the TSVs of an IC device at the top of a stack connect to the TSVs of an IC device below in the stack. By electrically connecting the IC devices in a stack, the TSVs enable the IC devices in the stack to function as a single device. TSV technology enables a 3D chip stack to have increased connectivity, bandwidth, and functionality, yet occupy a small footprint area.

Conventionally, a TSV structure is formed by deep etching into the wafer or the substrate, and filling the resulting hole with a liner and a conductive filling layer. Then, the wafer is thinned from its backside, until the conductive filling layer is exposed, and a backside metal and bumps are deposited on the thinned backside for electrical contact. A 3D stacked chip may have a huge amount of TSV structures, and the yield of whole wafer may worse as long as there is one TSV failed, such as open-circuit or poor contact. Accordingly, it is essential to test the TSVs in a 3D stacked IC. In conventional TSV test nowadays, the TSVs is always chained in series, for example one thousand TSVs are daisy-chained and the electrical properties of whole chain are measured for once. The disadvantage of this approach is that the test result can't reflect the abnormal performance of a small number of TSVs if the resistance of these TSVs abnormal or outlier. For example, some TSVs are defective in structure and material merely due to the variation and inadequate nature of the process. These TSVs are not entirely open-circuited or short-circuited in failure, so that the test result can't diagnose the abnormality of theses TSVs. Furthermore, the approach of measuring all of the TSVs in one chain for once can't find out the precise positions of abnormal TSVs, so that these problems can't be addressed by the follow-up electrical failure analysis or physical failure analysis according to the measurement result to solve the process issues. In addition, the 3D stacked chip nowadays may have a huge amount of TSV structures, even in an amount up to ten thousand, with relatively complex layout since they are used to connect different ICs. If we use conventional method mentioned above to measure the TSVs, it may require larger footprint area for test circuit (ex. test pads) and may spend a lot of time to complete the measurement of all TSV chains.

Therefore, current TSV testing method not only spends too much time in the measurement, but also fails to precisely measure or find out the positions of defective TSVs, especially for a few of those abnormal TSVs that is electrically outlier and partially failed.

SUMMARY OF THE INVENTION

To address the disadvantage of current measurement method for TSVs, the present invention hereby provides a novel circuit structure form testing TSVs, wherein an addressable test array is formed through a specific switch circuit to achieve scan testing by columns or by rows and to accurately address the positions of abnormal TSVs. The test data obtained from individual TSVs may be used in follow-up electrical diagnosis and analysis, which is particularly suitable for cooperating with a wafer acceptance test (WAT) tool to measure the TSVs in 3D IC.

One aspect of present invention is to provide a circuit structure for testing through silicon vias (TSVs) in three-dimensional integrated circuit, including a TSV region with multiple TSVs formed therein, and a switch circuit with multiple column lines and multiple row lines forming an addressable test array, wherein two ends of each TSV are connected respectively with one of the column lines and one of the row lines, and the switch circuit applies test voltage signals through one of the row lines to the TSVs in the same row and receives current signals flowing through the TSVs in the row from the columns lines, or the switch circuit applies test voltage signals through one of the column lines to the TSVs in the same column and receives current signals flowing through the TSVs in the column from the row lines.

Another aspect of present invention is to provide A circuit structure for testing through silicon vias (TSVs) in three-dimensional integrated circuit, including a TSV region with multiple TSVs formed therein, and a switch circuit with multiple column lines and multiple row lines forming an addressable test array, wherein an address of one of the column lines intersecting one of the row lines corresponds to one pair of the TSVs, and two ends of one the TSV in the pair of TSVs are connected respectively with one corresponding the row line and one redistribution layer, and two ends of the other TSV in the pair of TSVs are connected respectively with the redistribution layer and one corresponding the column line, and the switch circuit sends out voltage test signals to the TSVs in the same column through one of the column lines and receives current signals flowing through the TSVs in the column from the row lines, or the switch circuit sends out voltage test signals to the TSVs in the same row through one of the row lines and receives current signals flowing through the TSVs in the row from the column lines.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In various embodiments disclosed herein, a switch circuit enables integrated circuit (IC) device tests, ex wafer acceptance test (WAT), to be performed on one or more through silicon vias (TSVs) in a field of TSVs of the integrated circuit device, where each TSV is individually addressable for testing. The switch circuit includes an address decoder that selectably couples one or more TSVs to a test input and/or test sense circuit, all of which may be integrated into the IC device, such as a memory device. Embodiments enable testing that extends beyond TSVs of a single IC device. For example, embodiments may also test one or more chains of TSVs in a stack of IC devices, such as a memory stack. The test circuit may share resources (e.g., address decoder, external test equipment, test flows, etc.) with resources used for other tests (e.g., testing of memory arrays). Accordingly, embodiments disclosed herein provide accurate and efficient testing of TSVs with little overhead. Furthermore, in some embodiments, the techniques and methods described herein may be used to in conjunction with Wide IO memories, Hybrid Memory Cube memories, 3D stacked memories, or other related devices.

Figure 2:
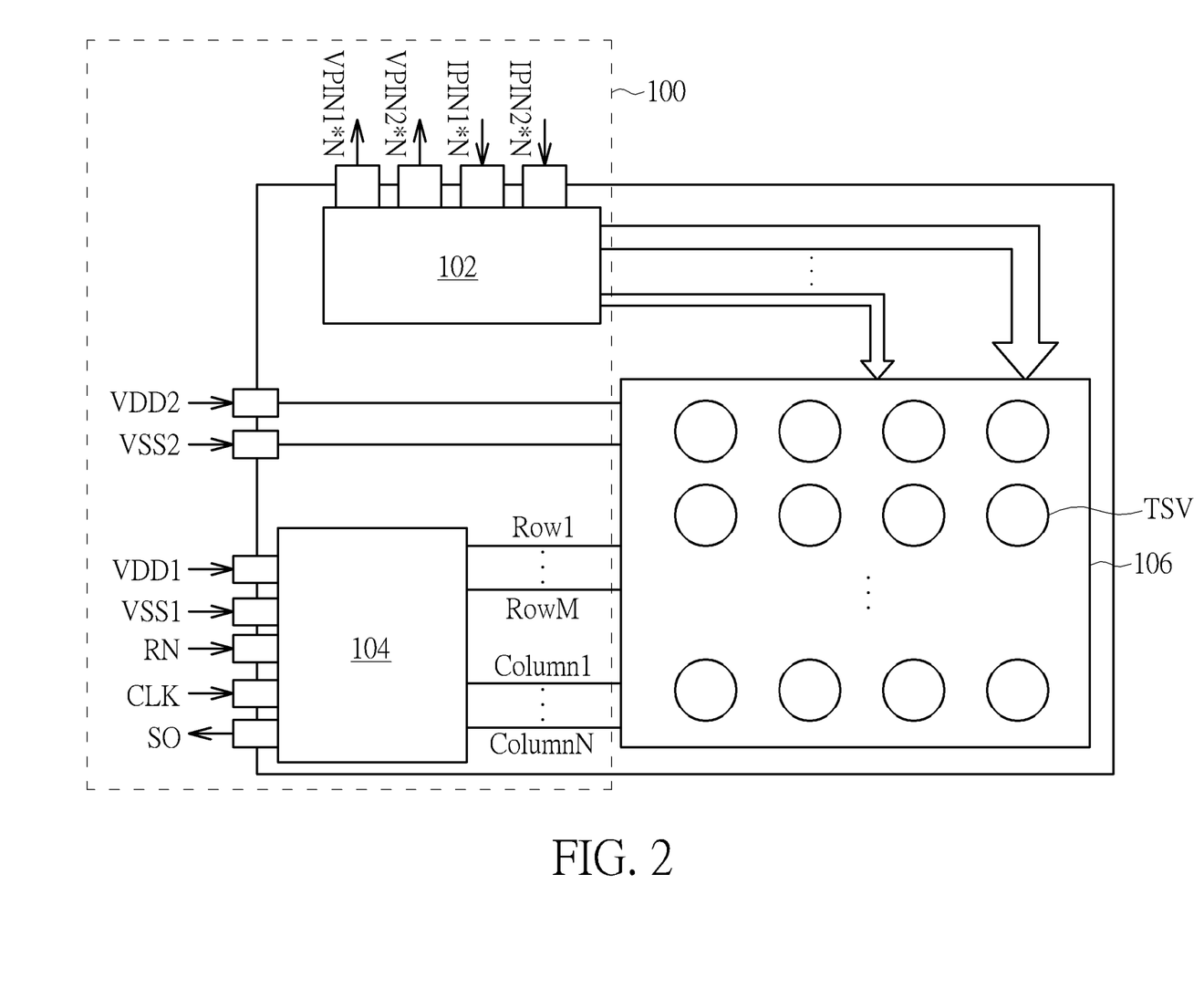
FIG. 2 is a schematic circuit diagram for testing the TSVs in a 3D IC in accordance with the embodiment of present invention.

Firstly, please refer to FIG. 2, which is a schematic circuit diagram for testing the TSVs in a 3D IC in accordance with the embodiment of present invention. As shown in figure, the TSVs testing circuit includes a switch circuit 100 and a TSV region 106. Multiple TSVs are formed in the TSV region 106, with an amount up to ten thousand. These TSVs are vertical interconnects for connecting multiple stacked wafers or chips in the 3D IC, so that electronic signal may be transmitted between different chips. As shown in the figure, TSVs may be arranged in an array in the TSV region 106 and may also be connected in a form of daisy chain, but not limited thereto.

Refer still to FIG. 2. The switch circuit 100 includes an analog sense circuit 102 and a test control circuit 104. The test control circuit 104 may include column decoder and row decoder that connect respectively with multiple column lines Column1~ColumnN and multiple row lines Row1~RowM. In the embodiment of present invention, column lines Column1~ColumnN and row lines Row1~RowM intersect to form an addressable test array. The addressable test array may correspond and connect to the TSVs in the TSV region 106 to individually address and test every TSV in the region. Please note that in the embodiment of present invention, the switch circuit 100 is integrated in an IC component, for example, being integrated in various volatile or non-volatile 3D stacked memory circuits or in a controller component, while the column decoder and row decoder of test control circuit 104 may also share with the IC component and adopt the same addressing mode. For example, the column decoder and row decoder may also be used to address the memory cells or memory components in a memory device, thereby reducing the footprint and cost required for the whole test structure.

In another aspect, the test control circuit 104 may couple with another external test circuit or device, such as the analog sense circuit 102 shown in the figure, which may be a source measure unit (SMU) in a wafer acceptance test (WAT) tool. The analog sense circuit 102 may provide test stimulus (ex. charges, alternating current (DC), bias pulse, test data or other information) to test TSVs. These stimulus are provided to the addressed TSVs through column lines Column1~ColumnN and row lines Row1~RowM of the control circuit 104, and may then be received by the text control circuit 104 to analyze and diagnose the electric properties of the TSVs. For example, provide a test voltage and receive the current flowing through the TSVs to analyze and diagnose if the electrical continuity of TSVs is normal or outlier or to compare the differences between two or more test results. In actual test, a WAT tool may electrically contact the pads or bumps on a device-under-test (DUT) through probe cards to transmit the test stimulus signal to the switch circuit and the DUTs and to receive the corresponding test results.

In one embodiment, the switch circuit 100 may connect various signal inputs and outputs, including the operating voltage VDD1, common ground voltage VSS1, signal for Norton's equivalent circuit RN, clock signal CLK and switch signal SO that are connected to the control circuit 104, and the operating voltage VDD2 and common ground voltage VSS2 that connect to the TSV region 106, and test voltage signals VPIN1, VPIN2 sent out and current signals IPIN1, IPIN2 received by the analog sense circuit 102. The test application may perform a variety of tests on the selected TSVs to test the quality of the selected TSVs (e.g., tests to determine shorts or opens, leakage tests based on capacitance, tests using pulsed-signal propagation, data compression tests, differential comparisons among two or more test results, etc.), and use the acquire information to perform electric failure analysis or physical failure analysis. In one embodiment, these tests may be performed on the die before assembly. In one embodiment, these TSV tests may occur when other pre-assembly tests of the IC device are performed (e.g., during the testing of memory cells of a memory device). In one embodiment, the test application may be executed by any suitable processor, and the test application provides instructions that enable the processor to perform the functions described herein. Also, the test application may be stored on any suitable storage location or computer-readable storage medium (e.g., any storage associated with an IC device test system, analyzer, etc.).

Figure 3:
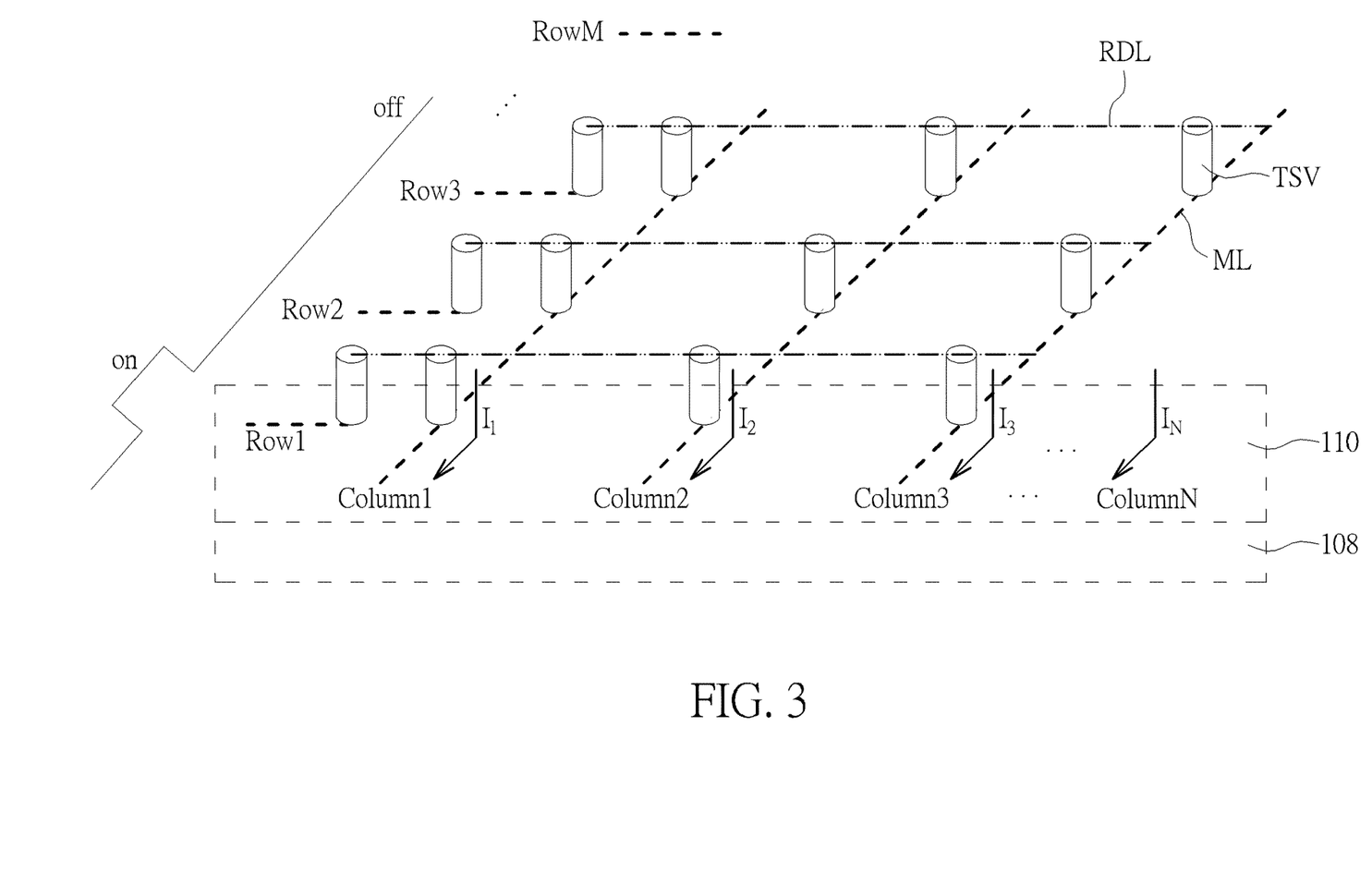
FIG. 3 is a schematic view of an addressable test array formed by intersecting column lines and row lines in accordance with the embodiment of present invention.

Next, please refer to FIG. 3, which is a schematic view of an addressable test array formed by intersecting column lines and row lines in accordance with the embodiment of present invention. As shown in FIG. 3, the addressable test array of present invention is consist of multiple column lines Column1~ColumnN and multiple row lines Row1~RowM in two different directions. The intersection of every column line and row line is considered as an address point that may correspond to a TSV under test, wherein two ends of each TSV are connected respectively with corresponding column line and row line. In one embodiment of present invention, parts of or the whole switch circuit 100 may be manufactured on a silicon substrate by using CMOS-compatible process. The column lines Column1~ColumnN may be the landing metals ML formed in the silicon wafer 110, while the row lines Row1~RowM may be or be included in a redistribution layer RDL formed on the surface of IC stacked structure. For example, the row lines and the column lines may be the metal lines formed in different silicon wafers or the metal lines formed in the same silicon wafer but in different layers or levels. In one embodiment of present invention, the TSVs in the same row are connected with each other through a redistribution layer RDL and may be connected to a corresponding row line through an outermost TSV in the array. The TSVs in the same column are connected directly with a corresponding column line. In actual test operation, the test control circuit 104 may select the row of TSVs to be test through the switches in the test control circuit 104. For example, as shown in the figure, only the channel of row line Row1 is selected and opened, and the test stimulus like test voltage is sent by the analog sense circuit 102 to one end of every TSV in the row Row1 through the redistribution layer RDL. Current $I_1$~$I_N$ are generated when this test voltage applied on these TSVs. The current $I_1$~$I_N$ may be transmitted to the test control circuit 104 through corresponding column lines Column1~ColumnN and may be received by specialized analytic platforms to generate analysis result. For example, if the current value resulted from a column line is abnormal or outlier, it reflects that the TSV at corresponding position where the row Row1 and the column line intersecting is defective. For example, it may be an electric anomaly or failure caused by minor pinholes or by entire short-circuit or open-circuit of the TSV.

Figure 4:
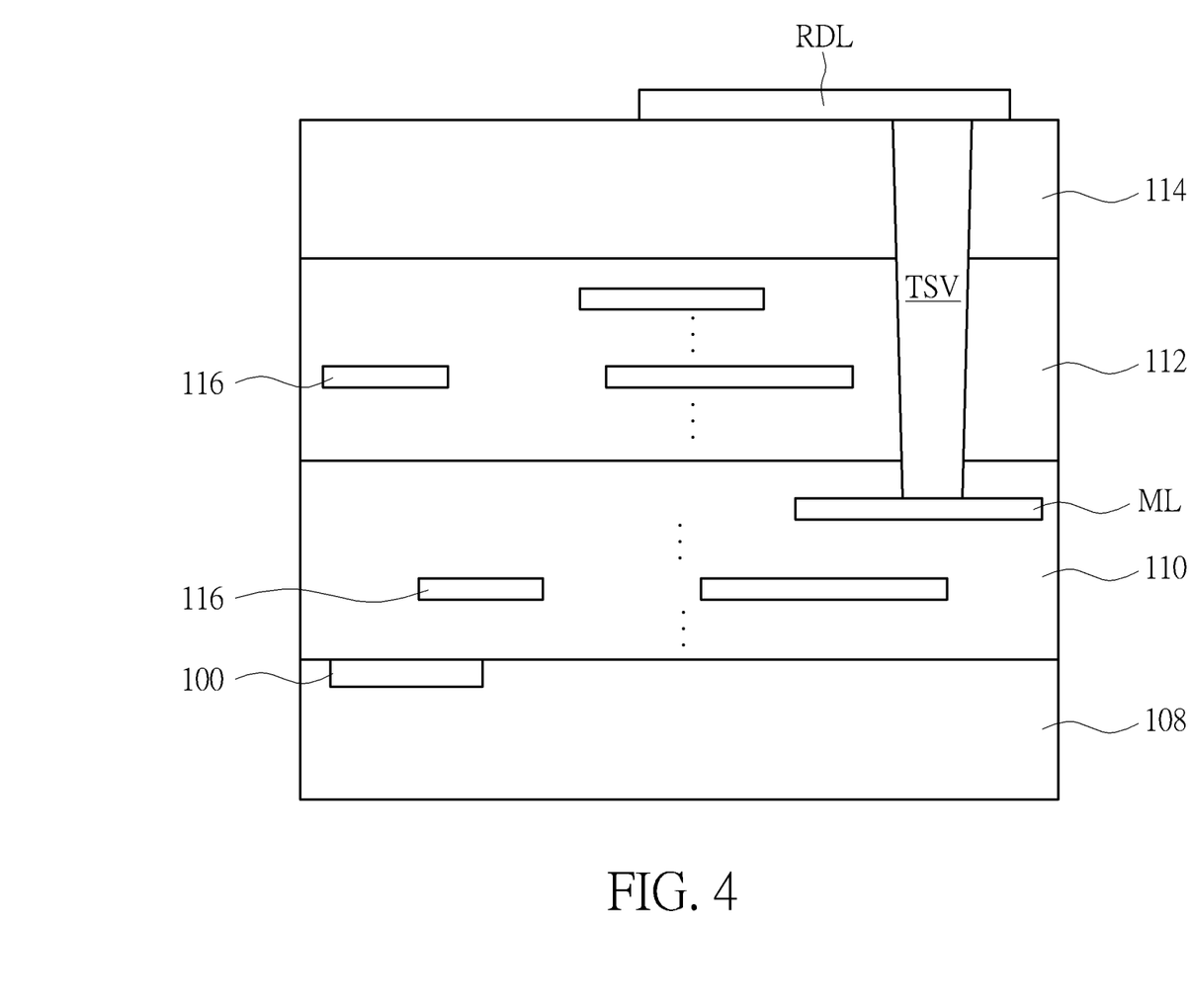
FIG. 4 is a schematic cross-section of the addressable test array shown in FIG. 3.

Next, please refer to FIG. 4, which is a schematic cross-section of the addressable test array shown in FIG. 3. The embodiment shown in the figure is a IC stacked structure formed by bonding two silicon wafers 110, 112. The outer sides of silicon wafers 110, 112 are bonded respectively with silicon substrates 108, 114. In this embodiment, the metal lines required by the TSV testing structure of present invention are set in the silicon wafers 110, 112 and may be formed through common semiconductor BEOL process. These metal lines may include the aforementioned landing metals ML (function as column lines), row lines and metal interconnects 116 required by other logic circuits. The switch circuit 100 consisted of switches and circuit components formed by gate and source/drain may be formed on the silicon substrate 108 through CMOS-compatible process. TSVs are formed from one side of the silicon substrate 114, for example, through the processes like deep etching and filling, which may penetrate through the silicon wafer 112 and electrically contact the landing metals (ex. the column lines in present invention) in the silicon wafer 110. The other end of the TSV is electrically connected with the redistribution layer RDL (which is further connected to the row lines of present invention) or bumps in order to transmit or receive signals from external circuits, such as the test control circuit 104 and WAT tools.

In actual implementation, 3D IC may be formed by stacking and bonding two or more levels of wafers and chips, wherein TSVs may be formed in every level and may be connected with each other in order to achieve circuit integration. For the clarity of drawings and descriptions, only two stacked silicon wafers and single TSV are shown in the figure. It should be noted that the embodiment and scope of present invention are not limited to the IC stacked structure shown in FIG. 4. The design and concept of present invention may be suitable for multilevel IC stacked structure and various types of TSVs, including the approaches of via first, via middle, via last and via after bonding.

Figure 5:
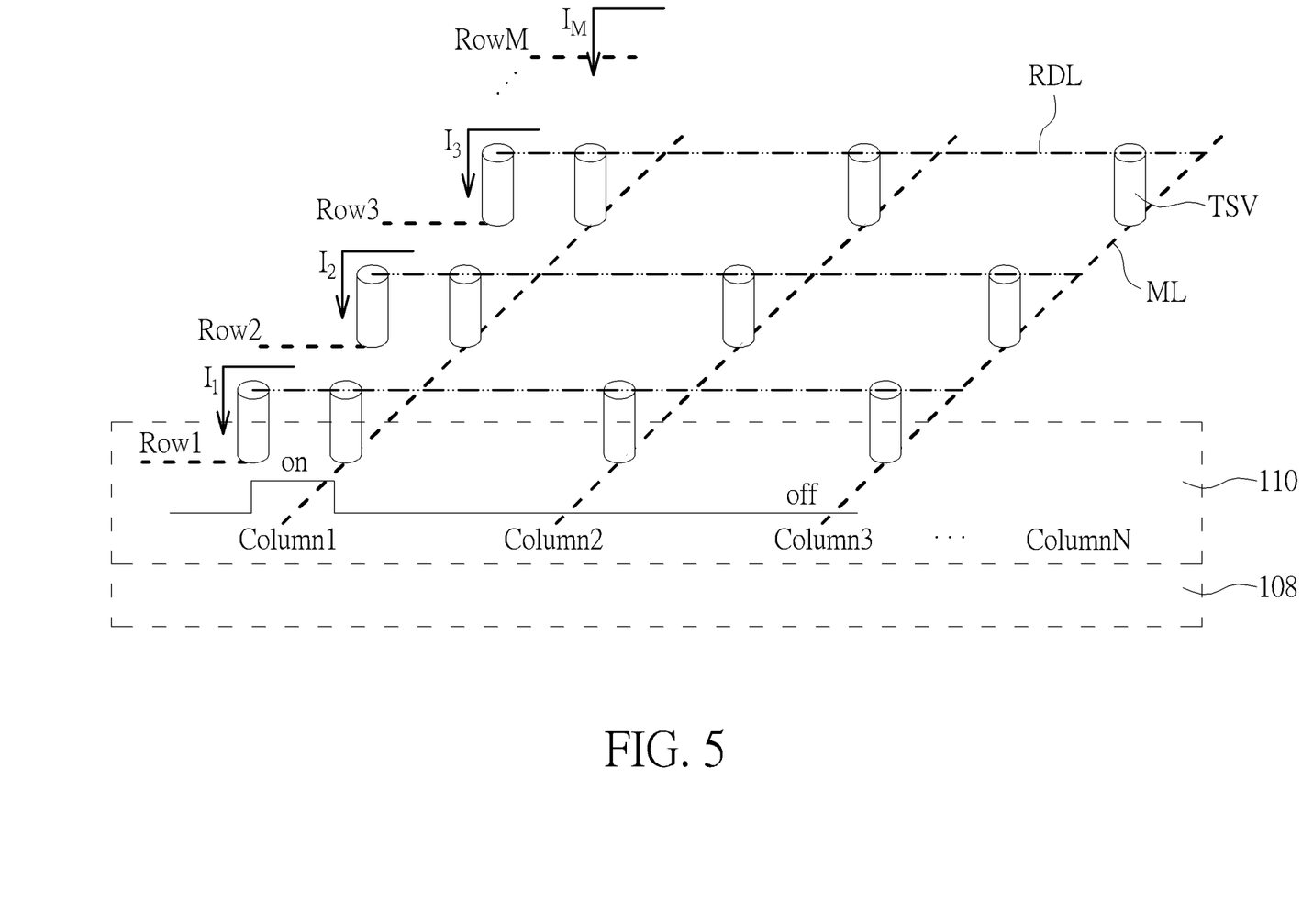
FIG. 5 is a schematic view of an addressable test array formed by intersecting column lines and row lines in accordance with another embodiment of present invention.

Next, please refer to FIG. 5, which is a schematic view of an addressable test array formed by intersecting column lines and row lines in accordance with another embodiment of present invention. The embodiment shown in FIG. 5 is similar to the one in FIG. 3, wherein the difference is that the test voltage signal in FIG. 5 is sent by column lines Column1~ColumnN. In actual test operation, the test control circuit 104 may select the TSVs columns to be test through the switches in test control circuit 104. As shown in the figure, only the channel of column line Column1 is selected and opened, and test stimulus like a test voltage is sent by the analog sense circuit 102 to one end of every TSV in the column Column1 through the landing metals (i.e. column lines) ML. Current $I_1$~$I_N$ are generated when this test voltage applied on the TSVs. The current $I_1$~$I_N$ may be transmitted to the test control circuit 104 through corresponding row lines Row1~RowM and may be received by specialized analytic platforms to generate analysis result.

Figure 6:
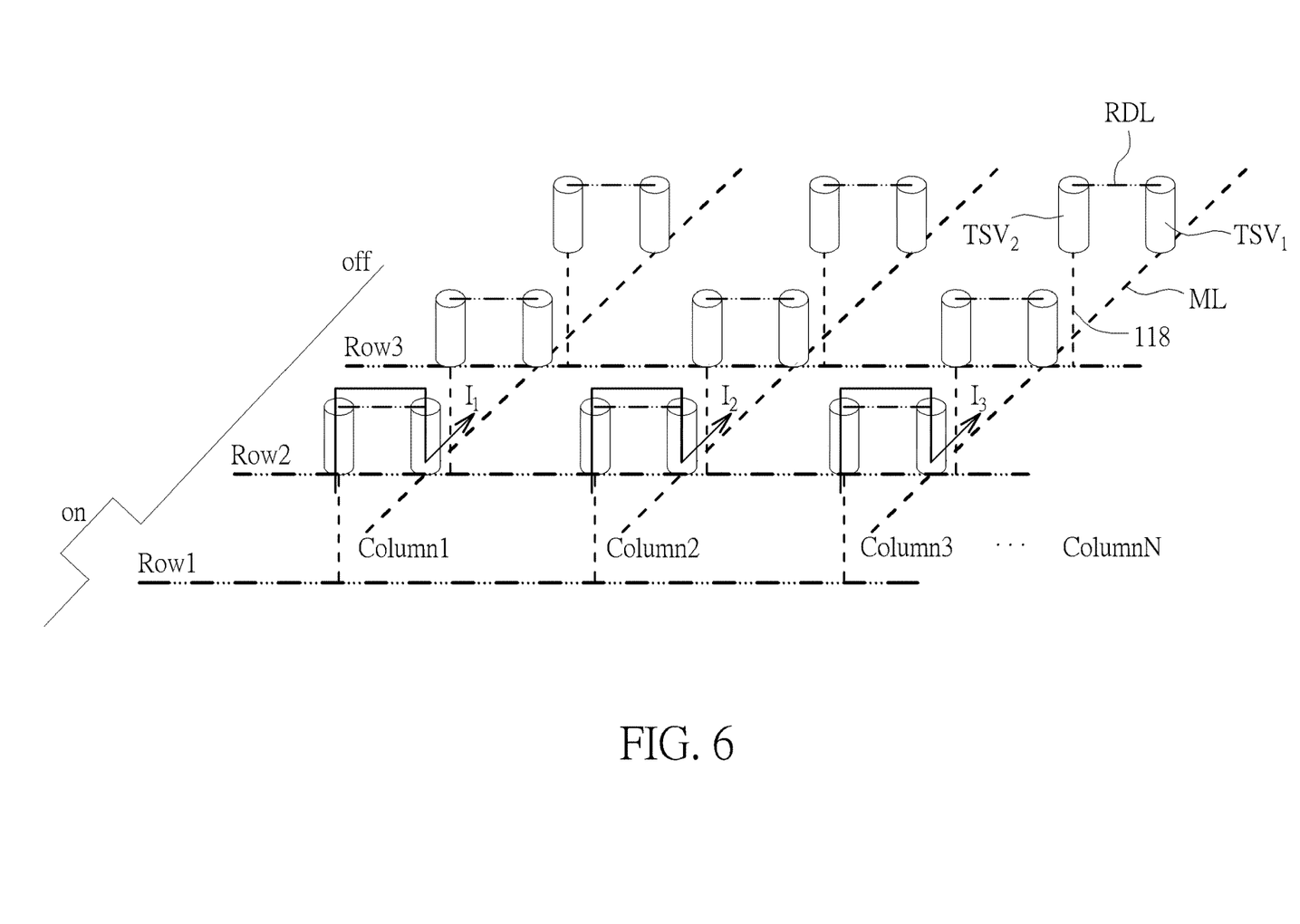
FIG. 6 is a schematic view of an addressable test array formed by intersecting column lines and row lines in accordance with still another embodiment of present invention.

Next, please refer to FIG. 6, which is a schematic view of an addressable test array formed by intersecting column lines and row lines in accordance with still another embodiment of present invention. The embodiment shown in FIG. 6 is similar to the one in FIG. 3, wherein the difference is that each address point in the FIG. 6 would correspond to a pair of TSVs (comprising $TSV_1$ and $TSV_2$), wherein one end of the $TSV_2$ is connected with a corresponding row line through a via 118, while the other end of the $TSV_2$ is connected with one end of the $TSV_1$ through the redistribution layer RDL, and the other end of the $TSV_1$ is connected with a corresponding column line. In actual test operation, the test control circuit 104 may select the TSV rows to be test through the switches in test control circuit 104. As shown in the figure, only the channel of row line Row1 is selected and opened, and test stimulus like a test voltage is sent by the analog sense circuit 102 to $TSV_2$ and further to paired $TSV_1$ through the redistribution layer RDL. Current $I_1$~$I_N$ are generated when this test voltage applied on these $TSV_1$, $TSV_2$. The current $I_1$~$I_N$ may be transmitted to test control circuit 104 through corresponding column lines Column1~ColumnN and may be received by specialized analytic platforms to generate analysis result.

Figure 7:
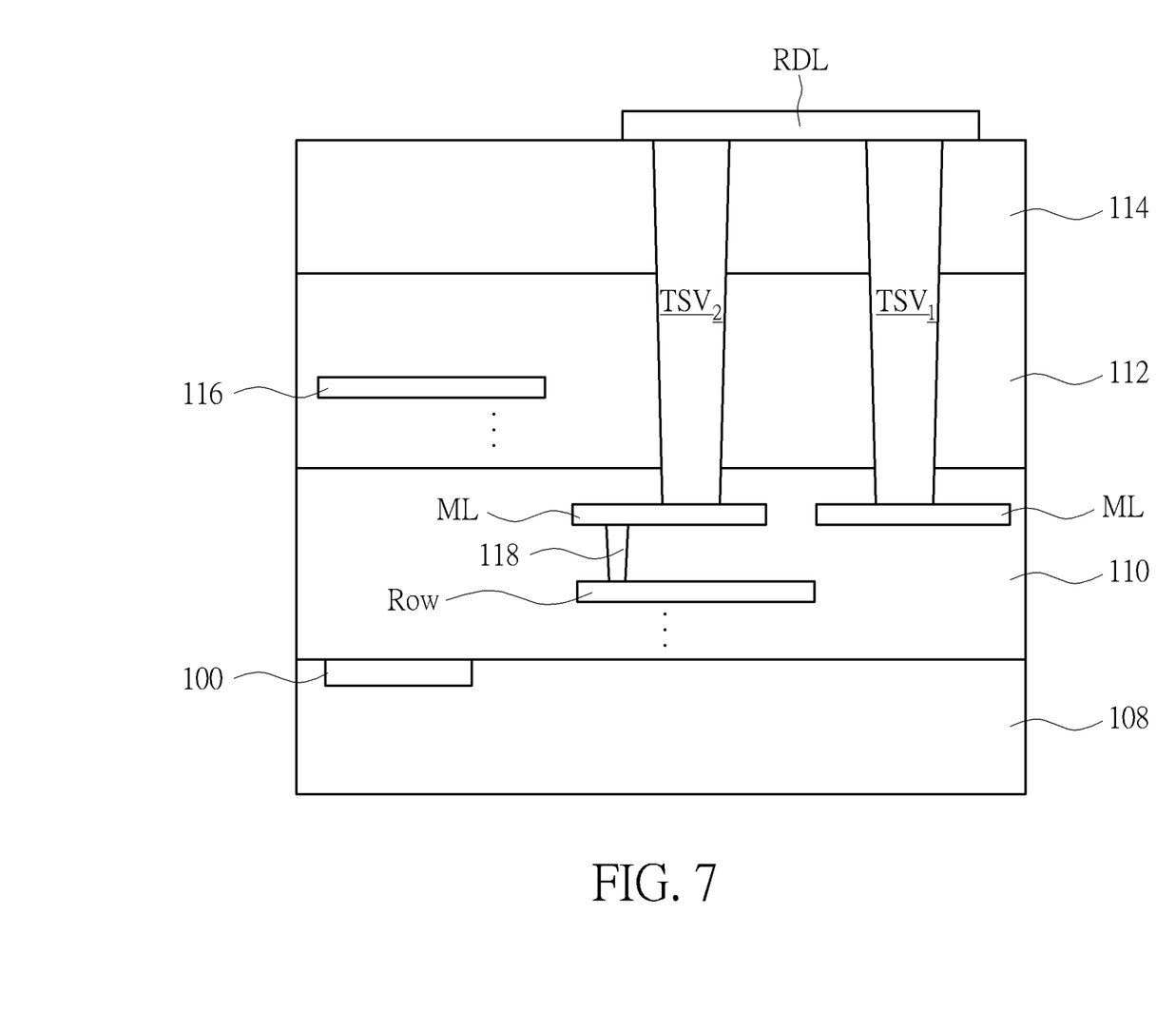
FIG. 7 is a schematic cross-section of the addressable test array shown in FIG. 6.

Next, please refer to FIG. 7, which is a schematic cross-section of the addressable test array shown in FIG. 6. The embodiment shown in the figure is a IC stacked structure formed by bonding two silicon wafers 110, 112. The outer sides of silicon wafers 110, 112 are bonded respectively with silicon substrates 108, 114. In this embodiment, metal lines required by the TSV testing structure of present invention are set in the silicon wafers 110, 112 and may be formed through common semiconductor BEOL process. These metal lines may include the aforementioned landing metals ML (function as column lines), vias 118, row lines and metal interconnects 116 required by other logic circuits. The switch circuit 100 consisted of switches and circuit components may be formed on the silicon substrate 108 through CMOS-compatible process. $TSV_1$ and $TSV_2$ are formed from one side of the silicon substrate 114, for example, through the processes like deep etching and filling, which may penetrate through the silicon wafer 112 and electrically contact the landing metals (i.e. the column lines in present invention) in the silicon wafer 110. The other ends of the $TSV_1$, $TSV_2$ are electrically connected with each other through the redistribution layer RDL. In the embodiment, $TSV_2$ is further connected to the row line (Row) that is in a different level from the column line ML through the via 118.

Figure 8:
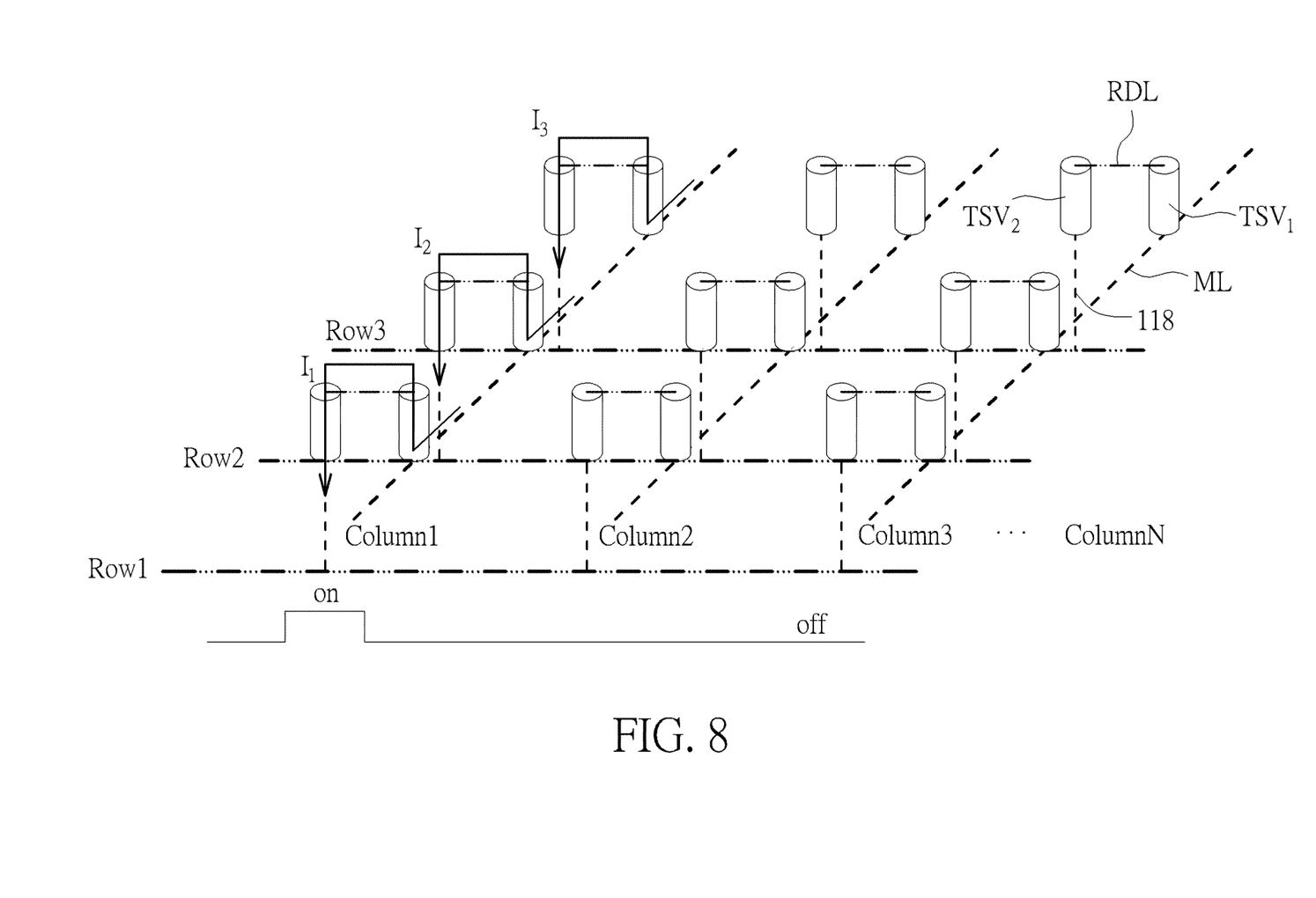
FIG. 8 is a schematic view of an addressable test array formed by intersecting column lines and row lines in accordance with still another embodiment of present invention.

Next, please refer to FIG. 8, which is a schematic view of an addressable test array formed by intersecting column lines and row lines in accordance with still another embodiment of present invention. The embodiment shown in FIG. 8 is similar to the one in FIG. 6, wherein the difference is that the test voltage signal in FIG. 8 is sent by column lines Column1~ColumnN. In actual test operation, the test control circuit 104 may select the TSV columns to be test through the switches in test control circuit 104. As shown in the figure, only the channel of column line Column1 is selected and opened, and test stimulus like a test voltage is sent by the analog sense circuit 102 to one end of every $TSV_1$ in the column Column1 through the landing metals ML (i.e. column lines). Current $I_1$~$I_N$ are generated when this test voltage applied sequentially through the $TSV_1$, the redistribution layer RDL and the $TSV_2$. The current $I_1$~$I_N$ may be transmitted to the test control circuit 104 respectively through corresponding row lines Row1~RowM and may be received by specialized analytic platforms to generate analysis result.

According to the aforementioned embodiment, it may be understood that the advantage of the TSV testing circuit structure provide by present invention is that an addressable test array may be formed by a specific switch circuit to achieve selective function, so that WAT tools and other test tools may scan by columns or by rows in the test instead of frequently changing the probing positions for the probe cards in convention measurement method, thereby significantly reducing the required time for test and required footprint for test pads. The approach of addressable test array may also precisely address the positions of abnormal TSVs. The test data acquired in the test may also be used in follow-up electrical analysis to obtain more accurate diagnosis results and to clarify and solve the process issues on these grounds.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit structure for testing through silicon vias (TSVs) in three-dimensional integrated circuit, comprising:
   a TSV region with multiple TSVs formed therein; and
   a switch circuit with multiple column lines and multiple row lines forming an addressable test array, wherein two ends of each TSV are connected respectively with one of said column lines and one of said row lines, and said switch circuit applies test voltage signals to said TSVs through one selected row line and receives current signals flowing through said TSVs in said selected row from said columns lines, or said switch circuit applies test voltage signals to said TSVs through one selected column line and receives current signals flowing through said TSVs in said selected column from said row lines.

2. The circuit structure for testing through silicon vias (TSVs) in three-dimensional integrated circuit of claim 1, wherein said TSVs in the same row in said TSV region are connected with each other through a redistribution layer, and said redistribution layer is further connected to one corresponding said row line.

3. The circuit structure for testing through silicon vias (TSVs) in three-dimensional integrated circuit of claim 2, wherein said redistribution layer is connected to said corresponding row line through one outermost said TSV in said TSV region.

4. The circuit structure for testing through silicon vias (TSVs) in three-dimensional integrated circuit of claim 1, wherein said TSVs in the same column in said TSV region are directly connected with one corresponding said column line.

5. The circuit structure for testing through silicon vias (TSVs) in three-dimensional integrated circuit of claim 1, wherein said switch circuit is set on a silicon substrate, and said silicon substrate is bonded with at least two stacked silicon wafers, and said TSVs, said column lines and said row lines are formed in said silicon wafers.

6. The circuit structure for testing through silicon vias (TSVs) in three-dimensional integrated circuit of claim 1, wherein said switch circuit comprises a test control circuit and an analog sense circuit, and said multiple column lines and said multiple row lines are connected with said test control circuit, and said test control circuit selects said row lines or said column lines to be sent with test voltage signals.

7. The circuit structure for testing through silicon vias (TSVs) in three-dimensional integrated circuit of claim 6, wherein said analog sense circuit is connected with or included in a wafer acceptance test tool, and said analog sense circuit is connected with said test control circuit and sends out said test voltage signals, and said test control circuit receives said current signals flowing through said TSVs.

8. A circuit structure for testing through silicon vias (TSVs) in three-dimensional integrated circuit, comprising:
   a TSV region with multiple TSVs formed therein; and
   a switch circuit with multiple column lines and multiple row lines forming an addressable test array, wherein an address of one of said column lines intersecting one of said row lines corresponds to one pair of said TSVs, and one said TSV in said pair of TSVs are connected with one corresponding said row line and one redistribution layer, and the other said TSV in said pair of TSVs are connected respectively with said redistribution layer and one corresponding said column line, and said switch circuit sends out voltage test signals to said TSVs through one selected column line and receives current signals flowing through said TSVs in said selected column from said row lines, or said switch circuit sends out voltage test signals to said TSVs through one selected row line and receives current signals flowing through said TSVs in said selected row from said column lines.

9. The circuit structure for testing through silicon vias (TSVs) in three-dimensional integrated circuit of claim 8, wherein one said TSV in each pair of said TSVs is directly connected with one corresponding said column line, and the other said TSV in each pair of said TSVs is connected with one corresponding said row line through a via.

10. The circuit structure for testing through silicon vias (TSVs) in three-dimensional integrated circuit of claim 8, wherein said column lines and said row lines respectively comprise metal lines formed in different silicon wafers.

11. The circuit structure for testing through silicon vias (TSVs) in three-dimensional integrated circuit of claim 8, wherein said column lines and said row lines respectively comprise metal lines formed in the same silicon wafer but in different layers.

12. The circuit structure for testing through silicon vias (TSVs) in three-dimensional integrated circuit of claim 8, wherein said switch circuit is set on a silicon substrate, and said silicon substrate is bonded with at least two stacked silicon wafers, and said TSVs, said column lines and said row lines are formed in said silicon wafers.

13. The circuit structure for testing through silicon vias (TSVs) in three-dimensional integrated circuit of claim 8, wherein said switch circuit comprises a test control circuit and an analog sense circuit, and said multiple column lines and said multiple row lines are connected with said test control circuit, and said test control circuit selects said row lines or said column lines to be sent with test voltage signals.

14. The circuit structure for testing through silicon vias (TSVs) in three-dimensional integrated circuit of claim 13, wherein said analog sense circuit is connected with or included in a wafer acceptance test tool, and said analog sense circuit is connected with said test control circuit and sends out said test voltage signals, and said test control circuit receives said current signals flowing through said TSVs.

* * * * *